US006498391B1

(12) United States Patent
Huang et al.

(10) Patent No.: US 6,498,391 B1
(45) Date of Patent: Dec. 24, 2002

(54) DUAL-CHIP INTEGRATED CIRCUIT PACKAGE WITH UNALIGNED CHIP ARRANGEMENT AND METHOD OF MANUFACTURING THE SAME

(75) Inventors: Chien-Ping Huang, Hsinchu Hsien (TW); Lian-Cherng Chiang, Taichung (TW); Michael Chang, Taiping (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/473,308

(22) Filed: Dec. 28, 1999

(30) Foreign Application Priority Data

Apr. 12, 1999 (TW) ........................................ 88105758 A

(51) Int. Cl.$^7$ ............................................. H01L 23/495
(52) U.S. Cl. ......................... 257/676; 257/784; 257/787
(58) Field of Search ................................ 257/672, 666, 257/676, 686, 723, 724, 784, 787; 438/123, 124

(56) References Cited

U.S. PATENT DOCUMENTS

| | | | |
|---|---|---|---|
| 5,012,323 A | | 4/1991 | Farnworth |
| 5,689,135 A | * | 11/1997 | Ball ............................ 257/676 |
| 5,804,874 A | * | 9/1998 | An et al. ..................... 257/676 |
| 5,898,212 A | * | 4/1999 | Kim ............................ 257/666 |

* cited by examiner

Primary Examiner—Olik Chaudhuri
Assistant Examiner—Hoai Pham
(74) Attorney, Agent, or Firm—Peter F. Corless; Steven M. Jenson; Edwards & Angell, LLP

(57) ABSTRACT

A dual-chip integrated circuit package with unaligned chip arrangement and a method of manufacturing such a dual-chip integrated circuit package are provided. The dual-chip integrated circuit package includes a leadframe having a first set of leads and a second set of leads. The dual-chip integrated circuit package is used to pack two integrated circuit chips in an unaligned chip arrangement, in which the first integrated circuit chip is mounted to one side of the inner part of the first set of leads, and the second integrated circuit chip is mounted to the other side of the same in such a manner as to allow the bonding pads on the second integrated circuit chip to be positioned in the spacing formed between the two sets of leads. This unaligned chip arrangement can help facilitate the wire-bonding process for the bonding pads are the second integrated circuit chip. An encapsulant is used for encapsulating the first integrated circuit chip, the second integrated circuit chip, the set of bonding wires, the second set of bonding wires, the inner part of the first set of leads, and the inner part of the second set of leads. The particular structure of the dual-chip integrated circuit package allows no restriction to the relative size between first two integrated circuit chips, thus allowing flexible selection for the combination of the two integrated circuit chips. Moreover, the dual-chip integrated circuit package are help save layout space on the circuit board and offers more functionality and storage capacity.

16 Claims, 8 Drawing Sheets

DUAL-CHIP INTEGRATED CIRCUIT PACKAGE WITH UNALIGNED CHIP ARRANGEMENT AND METHOD OF MANUFACTURING THE SAME

BACKGROUND OF THE INVENTION

1. Field of the Invention

This invention relates to integrated circuit (IC) packages, and more particularly, to a dual-chip integrated circuit package with unaligned chip arrangement and a method of manufacturing such a dual-chip integrated circuit package.

2. Description of Related Art

A DIP (Dual In-Line Package) is a type of integrated circuit package that includes a metal leadframe with a die pad and a plurality of leads. An integrated circuit chip is mounted on the die pad and electrically connected via a set of conductive wires to the leads, and as encapsulant is formed to encapsulate the entire integrated circuit chip, the entire die pad, and part of the lead fingers therein so as to allow easy handling and utilization of the integrated circuit package and to protect the enclosed integrated circuit chip from being contaminated or damaged by outside objects.

In the design and manufacture, it is usually desired to mount as many integrated circuit chips in a single integrated circuit package as possible so as to allow one single integrated circuit package to offer more functions. An integrated circuit package that packs two integrated circuit chips therein is customarily referred to as a dual-chip integrated circuit package. Since a dual-chip integrated circuit package packs two integrated circuit chips rather than just one, it can help save layout space out the circuit board and offers more functionality and storage capacity. A conventional dual-chip integrated circuit package is disclosed is U.S. Pat. No. 5,012,323, whose structure is briefly described in the following with reference to FIGS. 8–10.

As shown in FIG. 8, the U.S. Pat. No. 5,012,323 utilizes a dual-row leadframe 21 which includes a left part and a right part (as delimited by the dashed line 25). The left part includes a set of left-outer leads 23LO and a set of left-inner leads 23LI, while the right part includes a set of right-outer leads 23RO and a set of right-inner leads 23RI. Further, the left part is formed with a left slot 26L between the left-outer leads 23LO and the left-inner pads 23LI (as the area enclosed in the dashed box), while the right part is formed with a right slot 26R between the right-outer leads 23RO and the right inner leads 23RI (as the area enclosed in the dashed box). The dual-chip integrated circuit package is used to pack two integrated circuit chips therein, including an upper die 41 and a lower die 43, as shown in FIG. 9 and 10. The lower die 43 has its top side attached by means of an insulative adhesive layer 44 on the bottom side of the left-inner leads 23LI and the right-inner leads 23RI, while the upper die 41 has its back side attached by means of another insulative adhesive layer 42 as the upper side of the left inner leads 23LI and the right-inner leads 23RI. As illustrated in FIGS. 9 and 10, the lower die 43 should be greater in size than the upper die 41 so as to allow the left side 43L and the right side 43R of the lower die 43 to extend respectively into the left slot 26L and the right slot 26R; and the length from the left side 41L to the right side 41R of the upper die 41 should be less than the distance between the left-slot 26L and the right slot 26R so as to facilitate the wire-bonding process for electrically connecting the bonding pads 43LP and 43RP via the bonding wires 47 to the left-outer leads 23LO, the left-inner leads 23LI, the right-outer leads 23RO, and the right-inner leads 23RI. In a similar manner, the bonding pads 41LP, 41RP on the left side 41L and the right side 41R of the upper die 41 are electrically connected via the bonding wires 47 to the left-outer leads 23LO, the left-inner leads 23LI, the right-outer leads 23RO, and the right-inner leads 23RI. An encapsulant 24 is than molded to enclose the upper die 42, the lower die 43, the left-outer leads 23LO, the left-inner leads 23LI, the right-outer leads 23RO, and the right-inner leads 23RI.

The foregoing patent allows two integrated circuit chips of different purposes for example a microprocessor chip and a memory chip, to be packed in the same integrated circuit package. Moreover, since each integrated circuit chip is attached on the leads of the leadframe, it can help reduce the jointed area between the integrated circuit chip and the leads; and as a result, delamination between the integrated circuit chip and the leads can be prevented under temperature change conditions. One drawback to the forgoing patent, however, is that the lower die 43 should be greater in size than the upper die 41 (see FIGS. 9 and 10) so as to allow the left side 43L and the right side 43R of the lower die 43 to extend into the left-slot 26L and the right slot 26R for the purpose of positioning the bonding pads 43LP and 43RP in the left slot 26L and the right slot 26R to facilitate the wire-bonding process. For this reason, the foregoing patent is only suitable for use in TYPE II integrated circuit packages, which is the type whose outer leads are arranged on the longer sides of the integrated circuit package, and is unsuitable for use in TYPE I integrated circuit packages, which is the type whose outer leads are arranged on the shorter slides of the integrated circuit package. The flash memory chip is typically and suitably encapsulated a TYPE I integrated circuit package. Therefore, the foregoing patent cannot be used to pack two integrated circuit chips of which at least one is a flash memory chip to provide a doubled storage capacity from a single integrated circuit package. Still one more drawback to the foregoing patent is that the jointed area between each integrated circuit chip and the leads of the leadframe is still considered large.

SUMMARY OF THE INVENTION

It is therefore an objective of this invention a provide a dual-chip integrated circuit package and a method of manufacturing the same, which can be used to pack two integrated circuit chips of various relative sizes.

It is another objective of this invention to provide a dual-chip integrated circuit package wad a method of manufacturing the same, which is suitable for use to pack flash memory chips.

It is still another objective of this invention to provide a dual-chip integrated circuit package and a method of manufacturing the same, which can be manufactured through the use of conventional equipment and processes without having to use new ones.

In accordance with the foregoing and other objectives, the invention proposes a new dual-chip integrated circuit package and a method of manufacturing the same.

The dual-chip integrated circuit package of the invention includes the following constituent parts: (a) a leadframe having a first set of leads and a second set of leads, the first and second sets of leads being each defined into an inner part and an outer part, with a spacing being defined between the inner part of the first set of leads and the inner part of the second set of leads; (b) a first integrated circuit chip having a first side where at least one row of bonding pads are formed and a second side insulatively attached to a first side of the inner part of the first set of leads; (c) a second integrated circuit chip having a first side where at least one row of bonding pads are formed, with part of the first side being insulatively attached to a second side of the inner part of the first set of leads in such a manner as to allow the bonding pads on the second integrated circuit chip to be positioned in the spacing; (d) a first set of bonding wires for electrically connecting the bonding pads on the first integrated circuit chip to selected part of the leads; (e) a second set of bonding wires for electrically connecting the bonding pads on the second integrated circuit chip to selected part of the leads; and (f) an encapsulant for the first integrated circuit chip, the second integrated circuit chip, the first set of bonding wires, the second set of bonding wires, the inner part of the first set of leads, and the inner part of the second set of leads.

The first integrated circuit chip can be the type that is formed with only one row of bonding pads, such as flash memory chips, or the type that is formed with two rows of bonding pads, such as DRAM and ASIC chips. In the case of two rows, they are electrically connected respectively to the inner part of the first set of leads and the inner part of the second set of leads. The second integrated circuit chip, however, can be only the type formed with one row of bonding pads, which are electrically connected via the second set of bonding wires to the inner part of the first set of leads and/or the inner part of the second set of leads.

It is characteristic feature of the invention that the second integrated circuit chip is unaligned to the first integrated circuit chip in such a manner that the second integrated circuit chip has one part extending into the spacing between the inner part of the first set of leads and the inner part of the second set of leads to allow the bonding pads thereon to be positioned in the spacing. This unaligned chip arrangement allows no restriction to the relative sizes between the two integrated circuit chips, thus allowing flexible selection for the combination of the two integrated circuit chips.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, four embodiments are disclosed in full details in the following with reference to FIGS. 1–7.

In this specification, the terms "die" and "chip" are interchangeable, which refer to as integrated circuit device cut from a fabricated wafer.

First Preferred Embodiment (FIGS. 1–4)

The first preferred embodiment of the dual-chip integrated circuit package according to the invention is disclosed in the following with reference to FIGS. 1–4.

Figure 1:
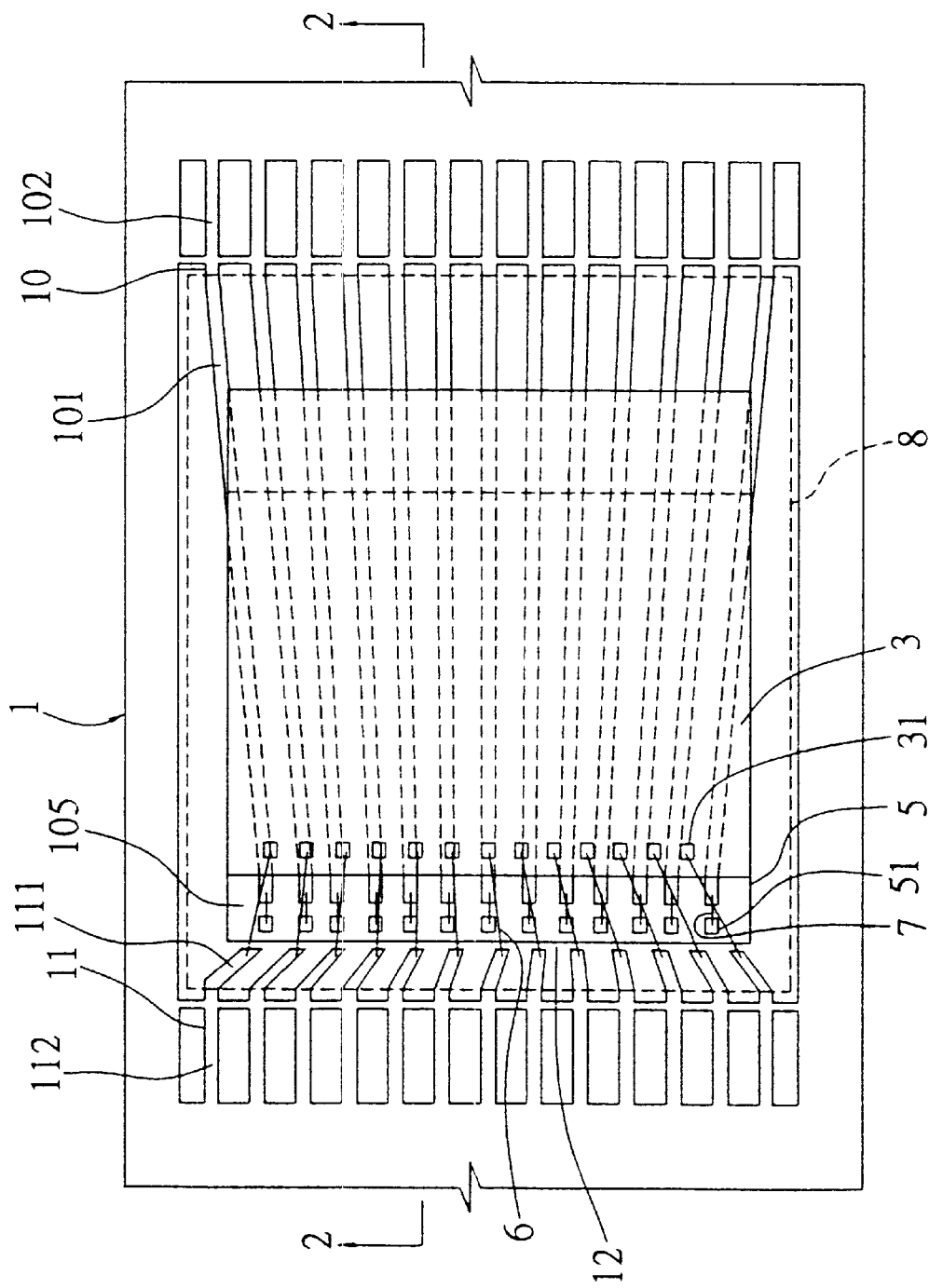
FIG. 1 shows a schematic top view of a first preferred embodiment of the dual-chip integrated circuit package according to the invention.
Figure 2:
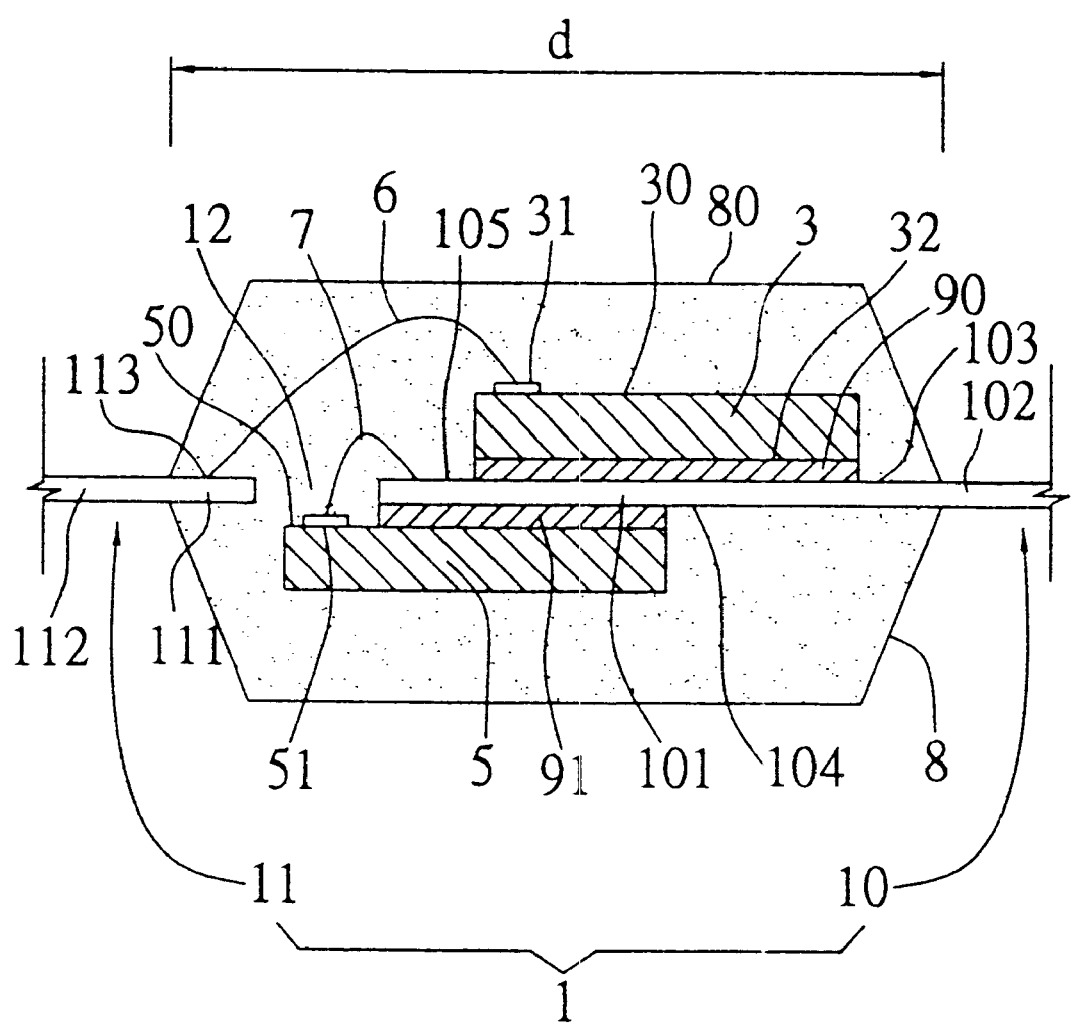
FIG. 2 shows a schematic sectional view of the dual-chip integrated circuit package of FIG. 1 cutting through the line 2—2.

As shown in FIGS. 1 and 2, the dual-chip integrated circuit package of the invention includes a leadframe 1, a first integrated circuit chip 3, a second integrated circuit chip 5, a first set of bonding wires 6, 7 second set of bonding wires 7, and an encapsulant 8. The leadframe 1 is formed with a first set of leads 10 and a second set of leads 11. The first integrated circuit chip 3 is mounted on one side of the first set of leads 10 while the second integrated circuit chip 5 is mounted an the opposite side of the same. The first set of bonding wires 6 are used to electrically connect the first integrated circuit chip 3 to the second set of leads 11; while the second set of bonding wires 7 are used to electrically connect the second integrated circuit chip 5 to the first set of leads 10. The encapsulant 8 is used to encapsulate the two integrated circuit chips 3, 5, the bonding wires 6, 7, and part of the leads 10, 11 therein.

The first set of leads 10 is defined into as inner part 101 and an outer part 102, with the inner part 101 being enclosed in the encapsulant 8 and the outer part 102 being exposed to the outside of the encapsulant 8. The inner part 101 of the first set of leads 10 has a front side 103 and a back side 104. The first integrated circuit chip 3 in mounted on the front side 103 of the inner part 141 of the first set of leads 10, while the second integrated circuit chip 5 is mounted on the back side 104 of the same. Similarly, the second set of leads 11 in defined into an inner part 111 and as outer part 112, with the inner part 111 being enclosed in the encapsulant 8 and the outer part 112 being exposed to the outside of the encapsulant 8. A spacing 12 is defined between the inner part 111 of the first set of leads 10 and the inner part 111 of the second set of leads 11, which allows the second set of bonding wires 7 to pass therethrough. In accordance with the invention, the inner part 101 of the first set of leads 10 should be greater is length than either the first integrated circuit chip 3 or the inner part 111 of the second set of leads 11, so that the spacing 12 can be located at a distance away from the center of the leadframe 1. The leadframe 1 in made of a conductive material, such as copper, are copper alloy, as alloy of ferrite and nickel. The first integrated circuit chip 3 can be electrically coupled to are external device (not shown) via the first act of leads 10 and/or the second set of leads 11 of the leadframe 1, while the second integrated circuit chip 5 can do the same via the first set of leads 10 and/or the second set of leads 11 of the leadframe 1. The outer parts 102, 112 of the leads 10, 11 can be bent through a trim/form process into either a gull-wing shape, a J-like shape, or are L-like shape.

In this preferred embodiment, the two integrated circuit chips 3, 5 are each a flash memory device, which is formed with only one row of pads, i.e., the first integrated circuit chip 3 is formed with one row of bonding pads 31 and the second integrated circuit chip 5 is also formed with only one row of bonding pads 51. The bonding pads 31 are formed on the front side 30 of the first integrated circuit chip 3 and positioned near the spacing 12, which are used to electrically connect the first integrated circuit chip 3 to the inner part 111 of the second sets of leads 11 via the first set of bonding wires 6. The back side 32 of the first integrated circuit chip 3 is attached by means of an insulative adhesive layer 90, such as a layer of polyimide resin or epoxy resin, are the front side 103 of the inner part 101 of the first set of leads 10, and which is positioned in such a manner as to leave a blank area 105 on the front edge of the inner part 101 of the first set of leads 10 to serve as a wire-bonding area for the second set of bonding wires 7. The front side 50 of the second integrated circuit chip 5 has one part attached by means of another insulative adhesive layer 91 on the back side 104 of the inner part 101 of the first set of leads 10, and the other part extending into the spacing 12 to allow the bonding pads 51 to be positioned within the spacing 12 so that the bonding pads 51 can be conveniently connected via the second set of bonding wires 7 to the inner part 101 of the first set of leads 10. This unaligned chip arrangement for the two integrated circuit chips 3, 5 allows a reduced dimension to the area of the inner part 101 of the chip first set of leads 10 that is attached to both of the two integrated circuit chips 3, 5, so that the invention can help eliminate the adverse effect of delamination due to temperature change in the encapsulating process that would otherwise occur in the prior art, thus making the resultant integrated circuit package more reliable in use. Moreover, since the two integrated circuit chips 3, 5 are attached to the leads of a leadframe rather that to a die pad, the jointed area between the chips and the leadframe can be reduced as compared to the prior art, so that the possibility of delamination can be further reduced.

With the invention, there is no restriction the relative size between the first integrated circuit chip 3 and the second integrated circuit chip 5, which means that the first integrated circuit chip 3 can be either greater than, equal to, or less that the second integrated circuit chip 5, provided that these two integrated circuit chips 3, 5 can be fitted to the inside space defined by the integrated circuit package.

The bonding wires 6, 7 are made of as electrically-conductive material, such as gold, copper, aluminum or an alloy of these metals. The first set of bonding wires 6 are connected between the bonding pads 31 on the first integrated circuit chip 3 and the front side 113 of the inner part 111 of the second set of leads 11, while the second set of bonding wires 7 are connected between the bonding pads 51 an the second integrated circuit chip 5 and the front side 103 of the inner part 101 of the first set of leads 10. Since the bonding wires 6, 7 are both connected to the front sides 103, 113 of the leads 10, 11, the wire-bonding process can be easily carried out with conventional equipment and process. Moreover, since the two integrated circuit chips 3, 5 are oppositely attached to the inner part 101 of the first set of leads 10, they can provide a more firm support to the wire-bonding process, allowing the bonding wires 6, 7 to be reliably bonded in position. Furthermore, since the second set of bonding wires 7 are separated by a substantial distance from the upper surface 80 of the encapsulant 8, it allows the second set of bonding wires 7 to be bonded having to use the precision wire looping control, allowing the manufacture process to be less complex.

Figure 4:
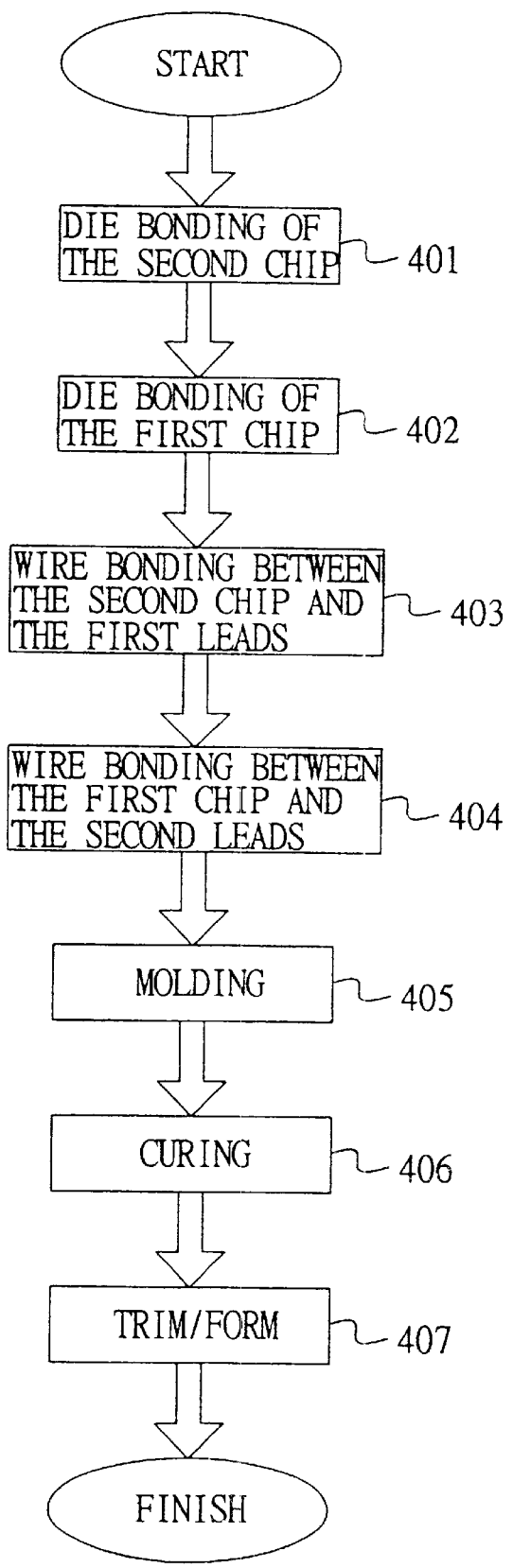
FIG. 4 is a flow diagram showing the procedural steps involved in the method according to the invention for manufacturing the dual-chip integrated circuit package.

FIG. 4 is a flow diagram showing the procedural steps involved in the method according to the invention for manufacturing the foregoing dual-chip integrated circuit package.

Figure 3:
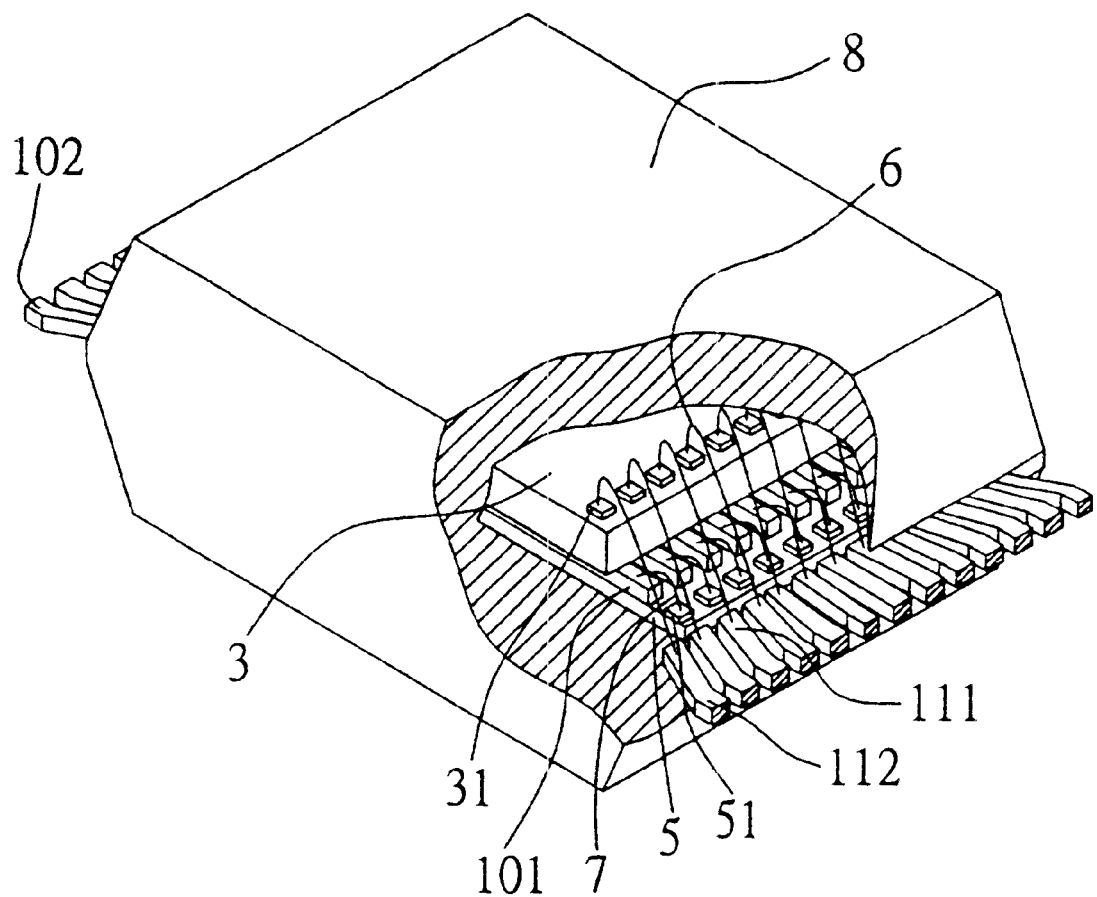
FIG. 3 shows a schematic perspective view of the deal-chip integrated circuit package of FIG. 1 with a part cut away to show the inside structure.

Referring to FIG. 4 together with FIGS. 1–3, in the first step 401, a first chip-mounting process is performed to mount the second integrated circuit chip 5 on the back side 104 of the inner part 181 of the first set of leads 10 in such a manner that a part of the second integrated circuit chip 5 in attached by means of an insulative adhesive layer 91 and the other part in extending into the spacing 12, allowing the bonding pads 31 on the front side 50 of the second integrated circuit chip 3 to be positioned in the spacing 12.

In the next step 402, without having to turn the leadframe 1 upside down, a second chip-mounting process in performed to mount the first integrated circuit chip 3 in such a manner that the back side 32 of the first integrated circuit chip 3 is attached by means of are insulative adhesive layer 90 on the front side 103 of the inner part 101 of the first set of leads 10.

In the next step 403, a first wire-bonding process is performed to bond the second set of bonding wires 7 between the bonding pads 31 on the second integrated circuit chip 5 and the wire-bonding area 105 on the inner part 101 of the first set of leads 10, allowing the second integrated circuit chip 5 to be electrically connected to the first set of leads 18. These bonding wires 7 pass through the spacing 12.

In the next step 404, a second wire-bonding process is performed to bond the first set of bonding wires 6 between the bonding pads 31 are the first integrated circuit chip 3 and the front side 113 of the inner part 111 of the second set of leads 11, allowing the first integrated circuit chip 3 to be electrically connected to the second set of leads 11.

Since the bonding wires 6, 7 are bonded to the front sides 103, 113 of the inner parts 101, 111 of the leads 10, 11, the second wire-bonding process needs just to coat silver on the front sides 103, 113 without having to turn the leadframe 1 upside down, making the overall manufacture process more simplified as compared to the prior art.

In the next step 405, a molding process is performed to form the encapsulant 8. Daring this process, since the two integrated circuit chips 3, 8 can be firmly supported by the first set of leads 10, the combined structure of the first integrated circuit chip 3, the second integrated circuit chip 5, and the first set of leads 10 would not be affected by the pressure from the encapsulation resin flow that would otherwise cause chip inclination and exposure of the bonding wires to the outside.

In the next step 406, a curing process is performed on the encapsulant 8. This process in a conventional technique so description thereof will not be further detailed.

In the final step 407, a trim/form process is performed on the leads 10, 11. This process is also a conventional technique so description thereof will not be further detailed. This completes the manufacture of the dual-chip integrated circuit package of the invention.

Figure 5:
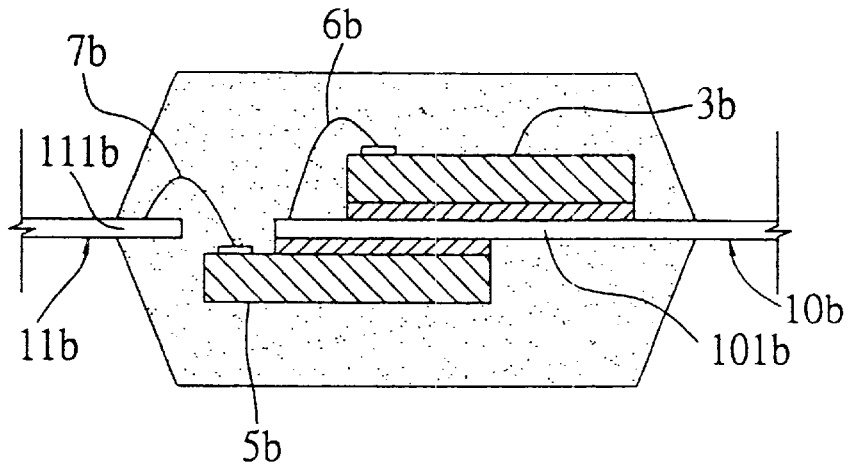
FIG. 5 is a schematic sectional diagram of a second preferred embodiment of the dual-chip integrated circuit package according to the invention.

Second Preferred Embodiment (FIG. 5)

FIG. 5 is a schematic sectional diagram of the second preferred embodiment of the dual-chip integrated circuit package according to the invention. For distinguishing purpose, the reference numerals in FIG. 5 are appended with the letter "b".

As shown, this embodiment differs from the previous one only in that the two sets of bonding wires 66, 76 are connected in a different manner; i.e., the first set of bonding wires 6b, 7b are used to electrically connect the first integrated circuit chip 3b to the first set of leads 10b (rather that the second set of leads 11b as in the case of the previous embodiment), and the second set of bonding wires 7b are used to electrically connect the second integrated circuit chip 5b to the side set of leads 11b (rather than the first set of leads 10b as in the case of the previous embodiment).

Figure 6:
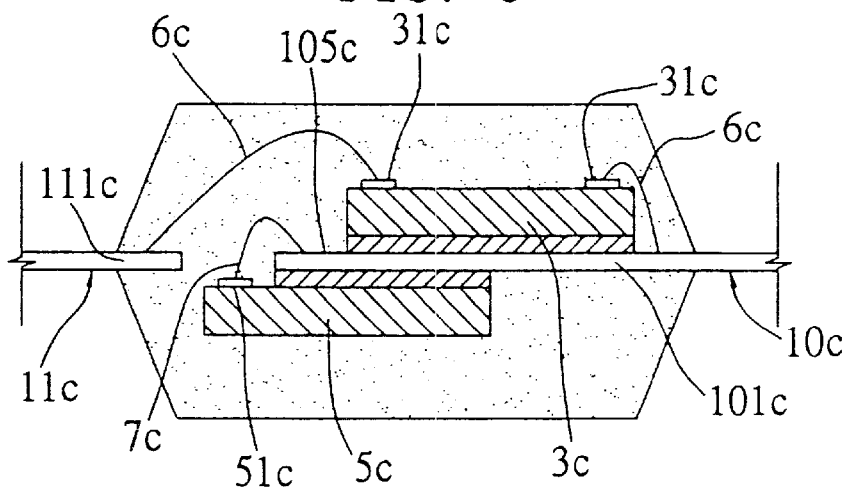
FIG. 6 is a schematic sectional diagram of a third preferred embodiment of the dual-chip integrated circuit package according to the invention.

Third Preferred Embodiment (FIG. 6)

FIG. 6 in a schematic sectional diagram of the third preferred embodiment of the dual-chip integrated circuit package according to the invention for distinguishing purpose, the reference numerals in FIG. 6 are appended with the letter "c".

In this embodiment the first integrated circuit chip 3c is the type that includes two parallel rows of bonding pads 31c, such as an ASIC chip or a DRAM chip, while the second integrated circuit chip the is a flash memory chip including only one row of bonding pads 51c. The two rows of bonding pads 31c are connected via a first set of bonding wires 6c respectively to the inner part 111c of the second set of leads 11c with to the inner part 101c of the first set of leads 10c, while the bonding pads 51c are electrically connected via a second set of bonding wires 7c to the wire-bonding area 105c in the inner part 101c of the first set of leads 10c.

Figure 7:
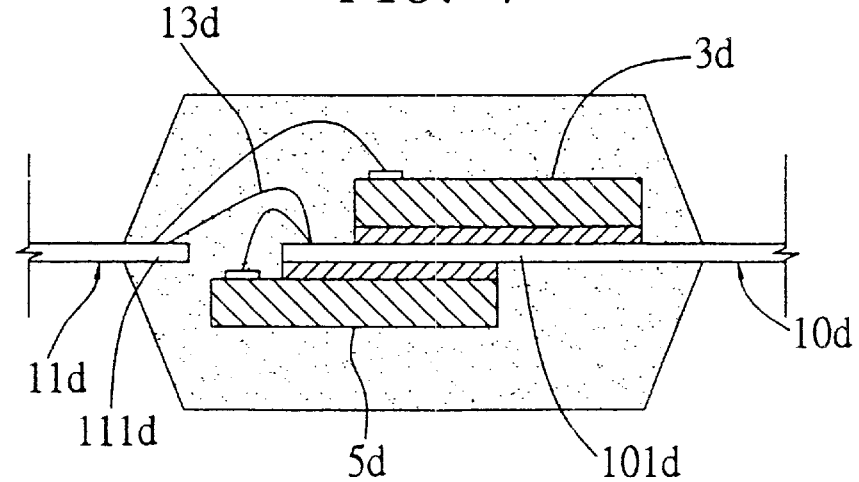
FIG. 7 is a schematic sectional diagram of a fourth preferred embodiment of the dual-chip integrated circuit package according to the invention.
Figure 8:
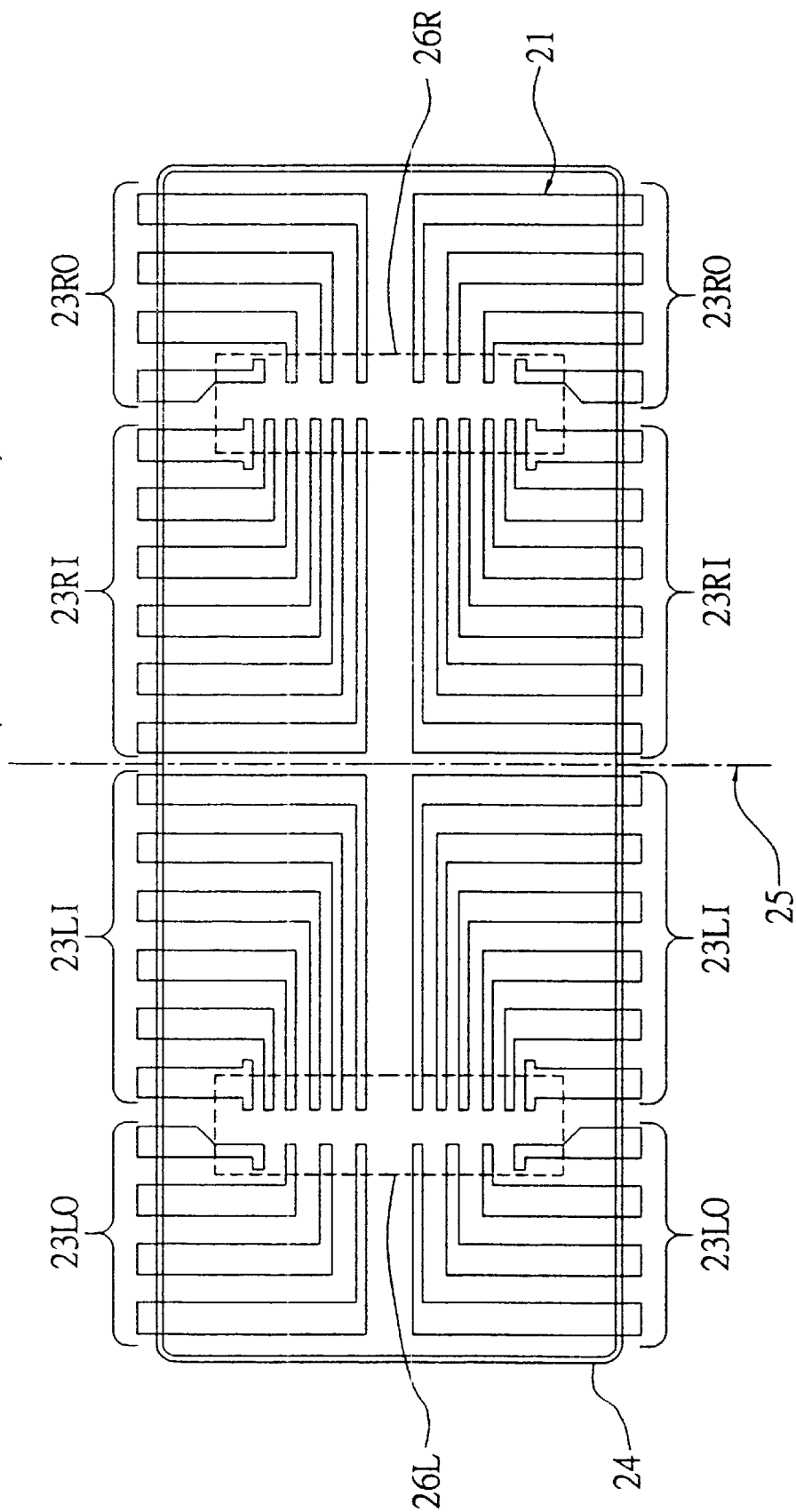
FIG. 8 (PRIOR ART) shows a schematic top view of a leadframe utilized in the dual-chip integrated circuit package disclosed in U.S. Pat. No. 5,012,323.
Figure 9:
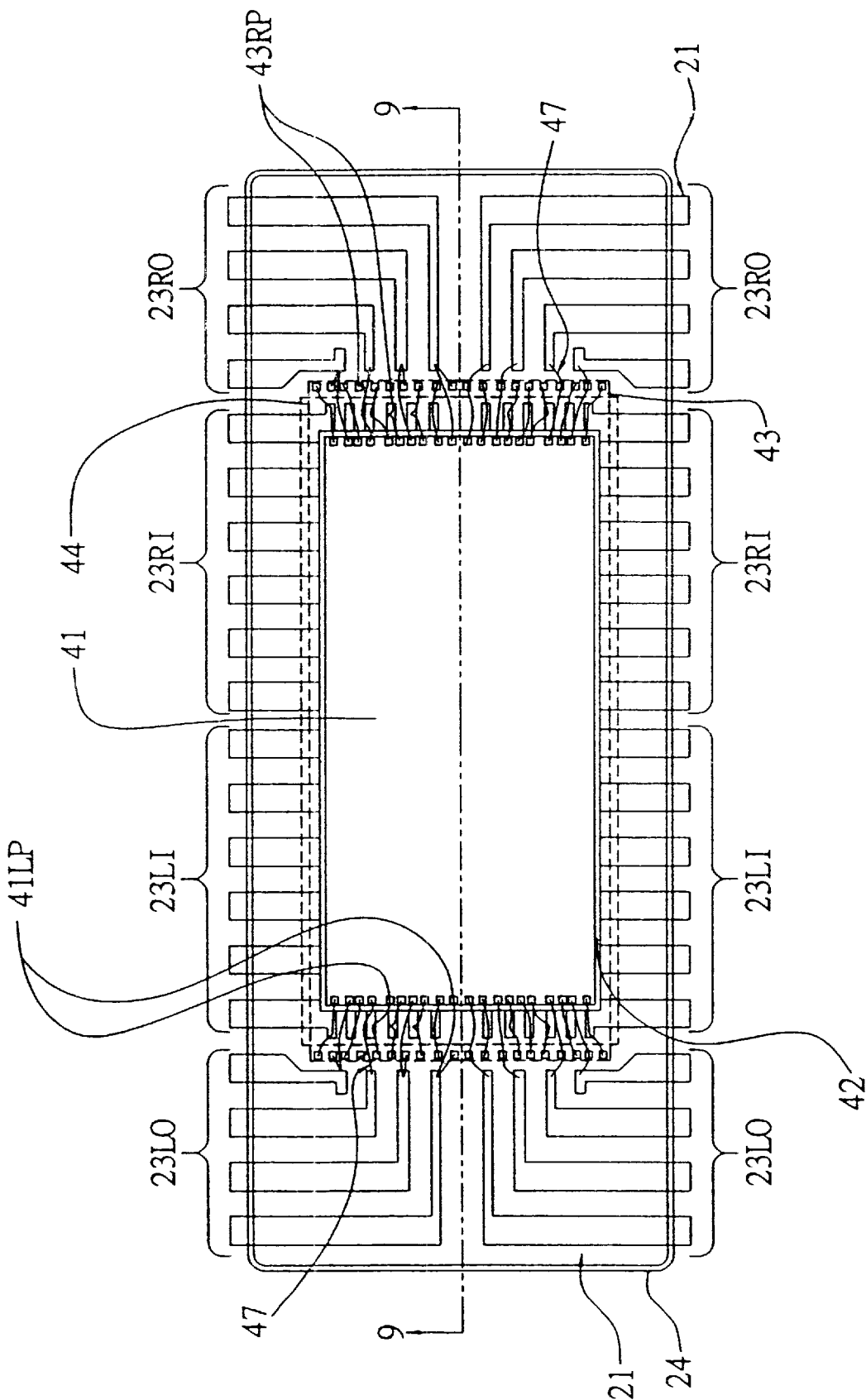
FIG. 9 (PRIOR ART) shows a schematic top view of the integrated circuit package of U.S. Pat. No. 5,012,323.
Figure 10:
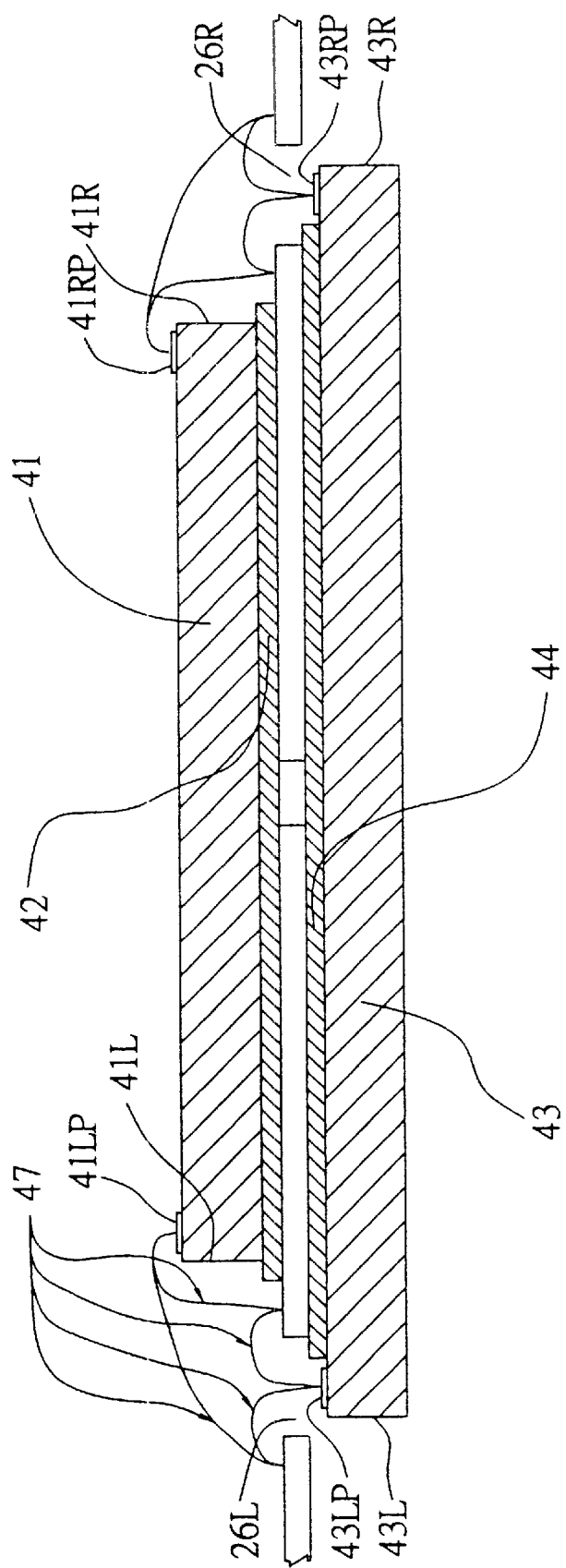
FIG. 10 (PRIOR ART) shows a schematic sectional view of the integrated circuit package of FIG. 9 through the line 10—10.

Fourth Preferred Embodiment (FIG. 7)

FIG. 7 is a schematic sectional diagram of the fourth preferred embodiment of the dual-chip integrated circuit package according to the invention. For distinguishing purpose, the reference numerals in FIG. 7 are appended with the letter "d".

As shown, this embodiment is mostly the same as the first embodiment except that an additional third set of bonding wires 13d are connected between the inner part 101d of the first set of leads 10d and the inner part 111d of the second set of leads 11d for the propose of parallel coupling the two integrated circuit chips 3d, 5d.

The invention has been described using exemplary preferred embodiments. However, it is to be understood that the scope of the invention is not limited to the disclosed embodiments. On the contrary, it is intended to cover various modifications and similar arrangements. The scope of the claims therefore, should be accorded the broadest interpretation so as to encompass with such modifications and similar arrangements.

What is claimed is:

1. A dual-chip integrated circuit package, which comprises:

a leadframe having a first set of leads arranged at one side of the leadframe, and a second set of leads arranged at an opposite side with respect to the first set of leads, allowing the first set of leads to be spaced apart from the second set of leads by a spacing, wherein each of the first and second sets of leads is defined into an inner part and an outer part, with the spacing being formed between the inner part of the first set of leads and the inner part of the second set of leads, and wherein the inner part of the first set of leads is greater in length that the inner part of the second set of loads, and the inner part of the first set of leads has a first side formed with a chip attach area and a second side opposite the first side;

a first integrated circuit chip having a first side where at least one row of bonding pads are formed and a second side insulatively attached to the chip attach area on the first side of the inner part of the first set of leads, wherein the first integrated circuit chip does not extend over the spacing between the inner parts of the first and second sets of leads;

a second integrated circuit chip having a first side where one row of bonding pads are formed, with the first side being insulatively partially attached to the second side of the inner part of the first set of leads in such a manner that the bonding pads on the second integrated circuit chip are positioned in the spacing;

a first set of bonding wires for electrically connecting the bonding pads on the first integrated circuit chip to a selected part of the leads of the leadframe;

a second set of bonding wires for electrically connecting the bonding pads on the second integrated circuit chip to a selected part of the leads of the leadframe; and an encapsulant for encapsulating the first integrated circuit chip, the second integrated circuit chip, the first set of bonding wires, the second set of bonding wires, the inner part of the first set of leads, and the inner part of the second set of leads.

2. The dual-chip integrated circuit package of claim 1, wherein the first integrated circuit chip is a flash memory chip.

3. The dual-chip integrated circuit package of claim 1, wherein the second integrated circuit chip is a flash memory chip.

4. The dual-chip integrated circuit package of claim 1, wherein the first integrated circuit chip includes two parallel rows of bonding pads on the first side thereof, which are respectively electrically connected to the inner pact of the first set of leads and the inner part of the second set of leads.

5. The dual-chip integrated circuit package of claim 4, wherein the first integrated circuit chip is an ASIC chip.

6. The dual-chip integrated circuit package of claim 4, wherein the first integrated circuit chip is a DRAM chip.

7. The dual-chip integrated package of claim 1, wherein in the case of the second integrated circuit chip being electrically connected via the second set of bonding wires to the inner part of the first set of leads, the first integrated circuit chip is electrically connected via the first set of bonding wires to the inner part of the second set of leads.

8. The dual-chip integrated circuit package of claim 1, wherein in the case of the second integrated circuit chip being electrically connected via the second set of bonding wires to the inner part of the second set of leads, the first integrated circuit chip is electrically connected via the first set of bonding wires to the inner part of the first set of leads.

9. The dual-chip integrated circuit package of claim 1, wherein in the case of the second integrated circuit chip being electrically connected via the second set of bonding wires to the inner part of the first set of leads, the first integrated circuit chip is electrically connected via the first set of bonding wires to both the inner part of the first set of leads and the inner part of the second set of leads.

10. The dual-chip integrated circuit package of claim 1, further comprising:

a third set of bonding wires for electrically connecting the inner part of the first set of leads to the inner package of the second act of leads.

11. The dual-chip integrated circuit package of claim 1 or 8, wherein the bonding wires are made of an electrically-conductive material.

12. The dual-chip integrated circuit package of claim 1, wherein the electrically-conductive material in selected from the group consisting of gold, copper, aluminum, and are alloy thereof.

13. The dual-chip integrated circuit package of claim 1, wherein the first integrated circuit chip is greater in size that the second integrated circuit chip.

14. The dual-chip integrated circuit package of claim 1, wherein the first integrated circuit chip is equal in size to the second integrated circuit chip.

15. The dual-chip integrated circuit package of claim 1, wherein the first integrated circuit chip is smaller in size that the second integrated circuit chip.

16. The dual-chip invention, circuit package of claim 1, wherein the first and second integrated circuit chips are insulatively attached to the first and second sides of the inner part of the first act of leads by means of as insulative adhesive layer.

* * * * *